(12) United States Patent
Yamada et al.

(10) Patent No.: US 6,590,475 B2
(45) Date of Patent: Jul. 8, 2003

(54) FILTER, ANTENNA DUPLEXER, AND COMMUNICATION APPARATUS INCORPORATING THE SAME

(75) Inventors: Yasuo Yamada, Kanazawa (JP); Kikuo Tsunoda, Osaka-fu (JP); Masayuki Atokawa, Kanazawa (JP); Hirofumi Miyamoto, Kanazawa (JP); Hajime Suemasa, Ishikawa-ken (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/838,391

(22) Filed: Apr. 19, 2001

(65) Prior Publication Data

US 2002/0105391 A1 Aug. 8, 2002

(30) Foreign Application Priority Data

Apr. 19, 2000 (JP) ........................................ 2000-118688
Dec. 1, 2000 (JP) ........................................ 2000-367580

(51) Int. Cl.[7] ................................ H01P 1/202; H01P 1/213
(52) U.S. Cl. ................................. 333/202; 333/134; 333/207
(58) Field of Search ............................... 333/101, 103, 333/104, 126–129, 132, 134, 175, 176, 202, 206, 207

(56) References Cited

U.S. PATENT DOCUMENTS

| 4,571,560 A | * | 2/1986 | Dobrovolny | 333/174 |
| 4,910,481 A | * | 3/1990 | Sasaki et al. | 333/134 |
| 6,307,448 B1 | * | 10/2001 | Atokawa et al. | 333/103 |
| 6,351,195 B1 | * | 2/2002 | Atokawa et al. | 333/134 |

FOREIGN PATENT DOCUMENTS

| JP | 63030003 | 2/1988 |
| JP | 07321509 | 12/1995 |

* cited by examiner

Primary Examiner—Seungsook Ham
(74) Attorney, Agent, or Firm—Dickstein, Shaprio, Morin & Oshinsky, LLP.

(57) ABSTRACT

A filter with which it is possible to control the relationship between a pass band and an attenuation band. In this filter, for example, a single-stage trap filter is electrically connected to a three-stage band pass filter via a coupling capacitor. The trap filter has a serial resonance section composed of a resonator and a resonance capacitor. The serial resonance section is connected in parallel to a capacitive reactance element (capacitor), and a serial circuit composed of an inductive reactance element (inductor) and a PIN diode as a switching element. The capacitive reactance element and the inductive reactance element both serve to make an admittance of the trap circuit substantially zero.

10 Claims, 10 Drawing Sheets

FILTER, ANTENNA DUPLEXER, AND COMMUNICATION APPARATUS INCORPORATING THE SAME

BACKGROUND OF THE INVENTION

1. Field of the Invention

The present invention relates to filters for use in a frequency band such as a microwave band, antenna duplexers, and communication apparatuses incorporating the same.

2. Description of the Related Art

FIG. 13 shows a conventional trap filter formed by using dielectric resonators (cf. Japanese Unexamined Patent Application Publication No. 63-30003). In a trap filter 201 disclosed in the publication, between an input terminal P1 and an output terminal P2, there are arranged a serial resonance section 203 composed of a capacitor C61 and a dielectric resonator 202, a reactance element 204 electrically connected in parallel to the serial resonance section 203. In FIG. 13, a capacitive reactance element is provided by a capacitor C62 connected to the serial resonance section 203.

In the conventional trap filter 201, however, with the reactance element 204 connected in parallel to the serial resonance section 203, the position of an anti-resonance frequency fa must be on either the frequency-side higher than an attenuation-pole frequency, or the frequency-side lower than the attenuation-pole frequency, but not both. That is, when a capacitor (capacitive reactance element) is used as the reactance element 204, the position of the anti-resonance frequency fa is always on the frequency side higher than the attenuation-pole frequency (see FIG. 14A). In contrast, when an inductor (inductive reactance element) is used as the reactance element 204, the position of the anti-resonance frequency fa is always on the frequency-side lower than the attenuation-pole frequency (see FIG. 14B). Thus, in the conventional trap filter 201, the position of the anti-resonance frequency fa cannot be freely switched between the frequency side higher than the attenuation-pole frequency and the frequency-side lower than that the attenuation-pole frequency.

In addition, as shown in FIG. 15, there is known a conventional band elimination filter 211 with variable attenuation-pole frequency. In FIG. 15, the reference numerals 212 and 213 denote distributed-constant lines having characteristic impedances. The reference numerals C71 and C72 denote capacitors for determining the magnitude of elimination-band attenuation. The reference numerals C73 and C74 denote frequency shifting capacitors for varying two attenuation-pole frequencies. These capacitors C73 and C74 serve to change inductive reactance generated by the distributed-constant lines 212 and 213, respectively. The reference numerals D71 and D72 denote PIN diodes, the reference numerals L71 and L72 denote choke coils. The reference numerals C75 and C76 denote bypass capacitors, the reference numerals r31 and r32 denote voltage-control supplying resistors, the reference numeral L74 denotes a coupling coil, and the reference numerals L73 and L75 denote coils.

When a positive voltage is applied to a voltage control terminal Vc1, the PIN diodes D71 and D72 are switched on. As a result, since the frequency shifting capacitors C73 and C74 are grounded via the PIN diodes D71 and D72, the two attenuation-pole frequencies both become lower (a solid line 215 shown in FIG. 16). When a negative voltage or 0 v is applied to the voltage control terminal Vc1, the PIN diodes D71 and D72 are switched off. As a result, since the capacitors C73 and C74 are open-circuited, the two attenuation-pole frequencies both become higher (a broken line 216 shown in FIG. 16).

In the band elimination filter 211, although the attenuation-pole frequencies can be varied by performing voltage control, it is impossible to significantly change the relationship between the pass band and the attenuation band. That is, in the conventional band elimination filter 211, the position of the attenuation band cannot be freely switched from the frequency-side higher than the pass band to the frequency-side lower than the pass band.

SUMMARY OF THE INVENTION

The present invention can provide a filter in which the relationship between a pass band and an attenuation band can be controlled. In addition, the invention can provide an antenna duplexer and a communication apparatus incorporating the filter.

In order to accomplish the above, according to a first aspect of the present invention, there is provided a filter including a trap circuit having a serial resonance section, a capacitive reactance element and an inductive reactance element for making an admittance of the trap circuit substantially zero, both reactance elements being electrically connected in parallel to the serial resonance section, and a switching element connected to one of the capacitive reactance element and the inductive reactance element and being switchable on/off. As the switching element, for example, a PIN diode or a field effect transistor may be used. As the voltage-controllable reactance element, for example, a variable capacitance diode may be used. In addition, the serial resonance section may include a dielectric resonator or a distributed-constant line.

When the switching element is switched on/off, a parallel reactance-element circuit composed of the capacitive reactance element and the inductive reactance element becomes either capacitive or inductive. That is, by the on/off control of the switching element, the position of an anti-resonance frequency fa can be freely switched between the frequency-side higher than an attenuation-pole frequency and the frequency-side lower than the attenuation-pole frequency.

In addition, the voltage-controllable reactance element may be electrically connected to each serial resonance section via a frequency shifting capacitor. With this arrangement, the reactance element is switched on/off by applying a control voltage, by which the frequency shifting capacitor is either grounded or open-circuited. As a result, the attenuation-pole frequency of the trap circuit can be varied.

Furthermore, a plurality of trap circuits having serial resonance sections may be electrically connected to each other by one of an inductive element and a capacitive element. With this arrangement, for example, a band elimination filter is formed. In the band elimination filter, by on/off switching of the switching element, the position of the attenuation band can be freely switched between the frequency-side higher than the pass band and the frequency-side lower than the pass band.

In addition, according to a second aspect of the invention, there is provided a filter including the filter of the first aspect and a band pass filter electrically connected thereto. With this arrangement, by switching the switching element on/off, the position of the anti-resonance frequency of the trap circuit can be freely switched between the frequency-side higher than the pass-band of the band pass filter and the frequency-side lower than that the pass-band of the band pass filter.

According to a third aspect of the invention, there is provided an antenna duplexer including one of the above filters. According to a fourth aspect of the invention, there is provided a communication apparatus incorporating at least one of the filters and/or the antenna duplexer described above. In both the duplexer and the communication apparatus, the freedom of design can be increased and the size reduction can be achieved.

Other features and advantages of the present invention will become apparent from the following description of embodiments of the invention which refers to the accompanying drawings, in which like references denote like elements and parts.

DETAILED DESCRIPTION OF EMBODIMENTS OF THE INVENTION

A description will be given of a filter, an antenna duplexer, and a communication apparatus according to embodiments of the present invention with reference to the attached drawings.

[First Embodiment: FIGS. 1 to 4]

Figure 1:
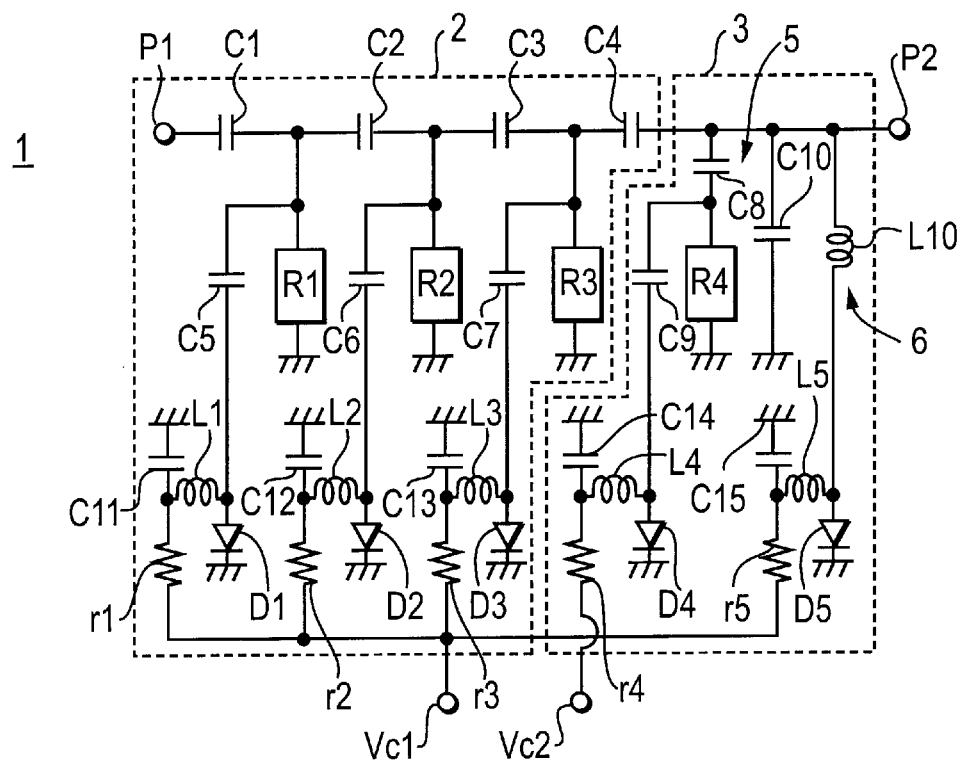
FIG. 1 is an electric circuit diagram of a filter according to an embodiment of the present invention.

A first embodiment of the invention will be illustrated by using an example of a trap-attached frequency-variable band pass filter. As shown in FIG. 1, in a trap-attached frequency-variable band pass filter 1, between external terminals P1 and P2, there is provided a three-stage band pass filter 2 electrically connected to a single-stage trap filter 3.

In the band pass filter 2, resonators R1, R2, and R3 are electrically connected to each other between the external terminals P1 and P2 via coupling capacitors C1, C2, C3, and C4. On the open-end side of the resonator R1, a serial circuit composed of a frequency shifting capacitor C5 and a PIN diode D1 as a voltage-controllable reactance element is electrically connected in parallel to the resonator R1 in a state in which the cathode of the PIN diode D1 is grounded. Similarly, on the open-end side of the resonator R2, a serial circuit composed of a frequency shifting capacitor C6 and a PIN diode D2 is electrically connected in parallel to the resonator R2, and on the open-end side of the resonator R3, a serial circuit composed of a frequency shifting capacitor C7 and a PIN diode D3 is electrically connected in parallel to the resonator R3.

The trap filter 3 has a serial resonance section 5 composed of a resonator R4 and a resonance capacitor C8. A capacitive reactance element (capacitor) C10 and a serial circuit composed of an inductive reactance element (inductor) L10 and a PIN diode D5 as a switching element are connected in parallel to the serial resonance section 5.

The capacitive reactance element C10 and the inductive reactance element L10 serve to prevent deterioration in pass-band characteristics of the band pass filter 1 caused by a load of the trap filter 3. Admittance Y of the trap circuit is formed by reactance X of a parallel reactance-element circuit 6 composed of the capacitive reactance element C10 and the inductive reactance element L10 and the serial resonance section 5. The admittance Y is obtained by the following equation (1).

$$Y=1/\{i(Za\cdot\tan\theta-1/C\omega)\}+1/X \qquad (1)$$

Here, $\theta$ is equal to $\pi\omega/2\omega_R$, the symbol Za indicates an impedance of the serial resonance section 5, the symbol $\omega_R$ indicates a resonance frequency of the resonator R4, and the symbol C indicates the velocity of light.

In order to prevent deterioration in the pass-band characteristics of the band pass filter 1, it is only necessary to make the value of Y equal to zero in the equation (1). The value of X is expressed by the following equation.

$$X=-i\{Za\cdot\tan(\pi\omega_O/2\omega_R)-1/(C\omega_O)\} \qquad (2)$$

Thus, it is only necessary to connect a reactance component with the value of X in parallel to the serial resonance section 5. In other words, in the case of $w_0$, when the serial resonance section 5 serves as an inductive reactance, it is only necessary to make the reactance X capacitive. In contrast, when the serial resonance section 5 serves as a capacitive reactance, it is only necessary to make the reactance X inductive. Therefore, it is found that, when an attenuation-pole frequency generated by the serial resonance section 5 is present on a frequency-side higher than a pass band of the band pass filter 1, the reactance X needs to be inductive, whereas when the attenuation-pole frequency is present on a frequency-side lower than the pass band thereof, the reactance X needs to be capacitive.

At the junction between the resonator R4 and the resonance capacitor C8, a serial circuit composed of a frequency shifting capacitor C9 and a PIN diode D4 as a voltage-controllable reactance element is connected in parallel to the resonator 4 in a state in which the cathode of the PIN diode D4 is grounded. The frequency shifting capacitor C9 is a capacitor for varying one attenuation-pole frequency of the attenuation characteristics of the trap filter 3.

A voltage control terminal Vc1 is connected to the anode of the PIN diode D1 via a control-voltage supplying resistor r1, a capacitor C11, and a choke coil L1, as shown. It is also connected to the anode of the PIN diode D2 via a control-voltage supplying resistor r2, a capacitor C12, and a choke coil L2. In addition, the voltage control terminal Vc1 is connected to the anode of the PIN diode D3 via a control-voltage supplying resistor r3, a capacitor C13, and a choke coil L3, and is also connected to the anode of the PIN diode D5 via a control-voltage supplying resistor r5, a capacitor C15, and a choke coil L5. A voltage control terminal Vc2 is connected to the anode of the PIN diode D4 via a control-voltage supplying resistor r4, a capacitor C14, and a choke coil L4.

Figure 2:
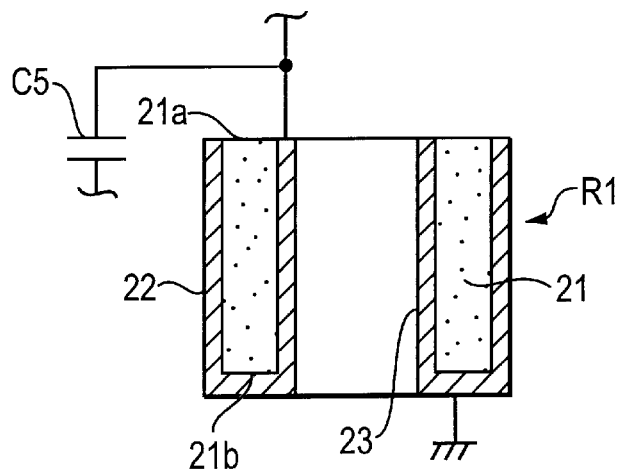
FIG. 2 is a sectional view for illustrating an example of a resonator used in the filter shown in FIG. 1.

As each of the resonators R1 to R4, for example, as shown in FIG. 2, a dielectric resonator is used. In FIG. 2, the resonator R1 shown as a representative example. In each of the dielectric resonators R1 to R4, there is provided a tube-shaped dielectric member 21, which is made of a high permittivity material such a $TiO_2$ ceramic. An outer conductor 22 is disposed on the outer peripheral surface of the tube-shaped dielectric member 21 and an inner conductor 23 is disposed on the inner peripheral surface thereof. The outer conductor 22 is electrically isolated from the inner conductor 23 at an open end face 21a (hereinafter referred to as an open-side end face 21a) of the dielectric member 21, and is electrically short-circuited to the inner conductor 23 at the remaining open end face 21b (hereinafter referred to as a short-circuited-side end face 21b). In the dielectric resonator R1, the open-side end face 21a thereof is electrically connected to the serial circuit composed of the frequency shifting capacitor C5 and the PIN diode D1, and the outer conductor 22 is grounded at the short-circuited-side end face 21b.

Next, a description will be given of the functional effects of the trap-attached frequency-variable band pass filter 1 having the above structure.

A pass frequency of the band pass filter 2 is determined by the respective resonance frequencies of the resonance system formed by the frequency shifting capacitor C5 and the resonator R1, the resonance system formed by the frequency shifting capacitor C6 and the resonator R2, and the resonance system formed by the frequency shifting capacitor C7 and the resonator R3. An attenuation-pole frequency of the trap filter 3 is determined by a resonance frequency of the resonance system formed by the frequency shifting capacitor C9, the resonance capacitor C8, and the resonator R4.

Figure 3:
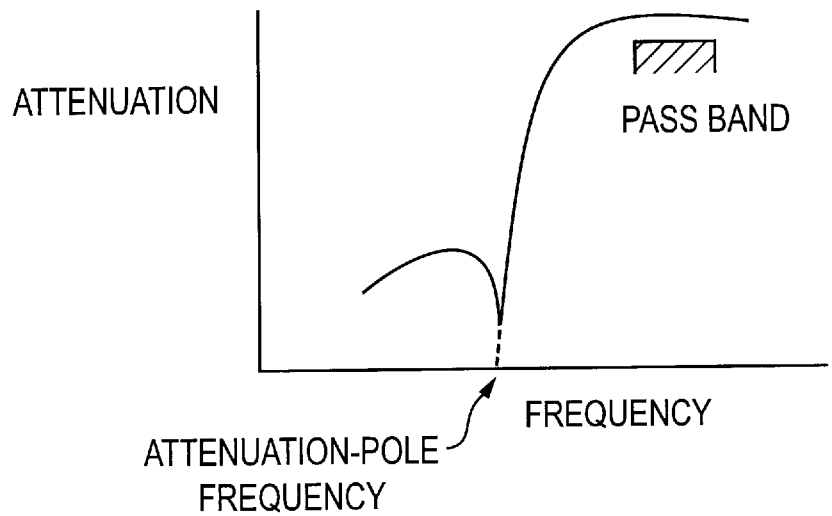
FIG. 3 is a graph showing frequency characteristics for illustrating a function of the filter shown in FIG. 1.
Figure 14A:
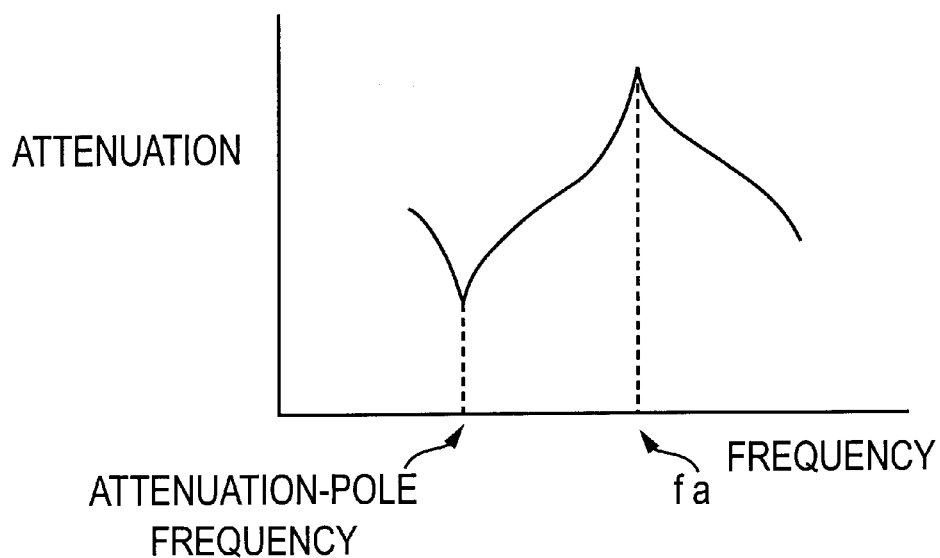
FIGS. 14A and 14B are graphs showing filter characteristics of the trap filter shown in FIG. 13.

When a negative voltage or 0V is applied to the voltage control terminal Vc1 and a positive voltage is applied to the voltage control terminal Vc2, the PIN diodes D1, D2, D3, and D5 are switched off, whereas the PIN diode D4 is switched on. As a result, since the frequency shifting capacitors C5, C6, and C7 of the band pass filter 2 are open-circuited, as shown in FIG. 3, the pass frequency of the band pass filter 2 becomes higher. In contrast, since the frequency shifting capacitor C9 of the trap filter 3 is grounded via the PIN diode D4, the attenuation-pole frequency of the trap filter 2 becomes lower. The attenuation-pole frequency is thereby set to be a frequency lower than the pass-band frequency of the band pass filter 2. In addition, since the inductive reactance element L10 of the trap filter 3 is open-circuited, the reactance X of the parallel reactance-element circuit 6 composed of the capacitive reactance element C10 and the inductive reactance element L10 becomes capacitive. As a result, the position of the anti-resonance frequency fa of the trap filter 3 is present on a frequency-side higher than the attenuation-pole frequency (as in the conventional example illustrated in FIG. 14A). Additionally, the position of the anti-resonance frequency fa thereof is set within the pass band of the band pass filter 2.

Figure 4:
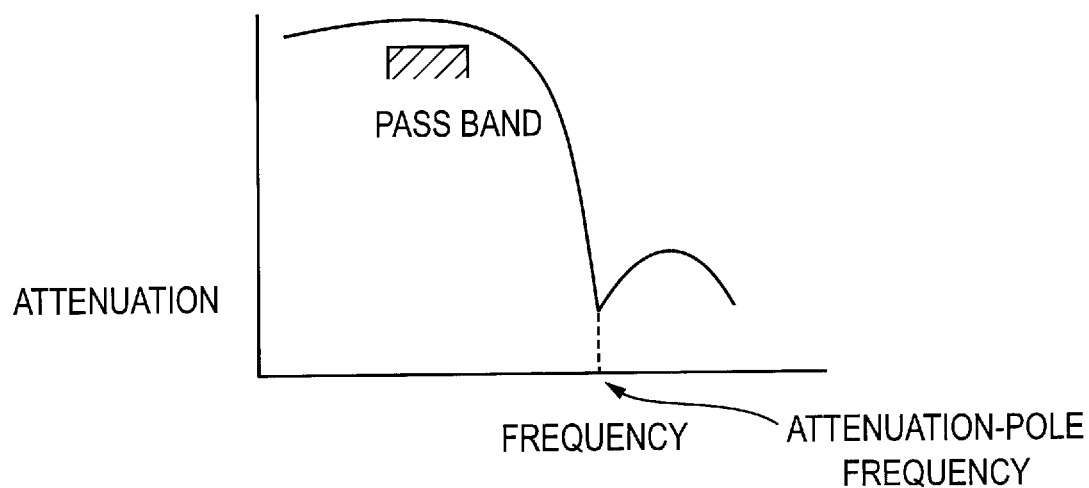
FIG. 4 is a graph showing frequency characteristics for illustrating another function of the filter shown in FIG. 1.
Figure 14B:
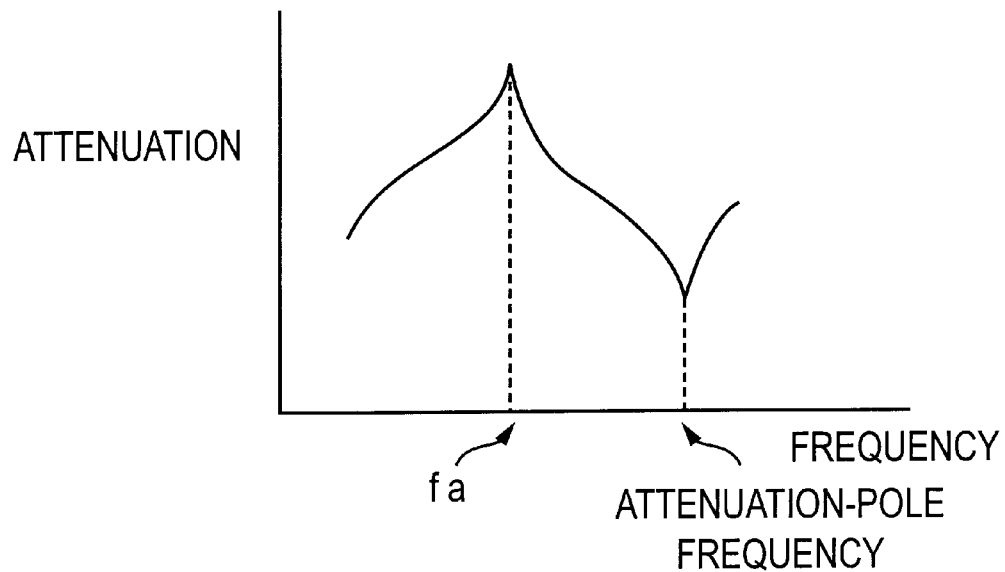
Figure 15:
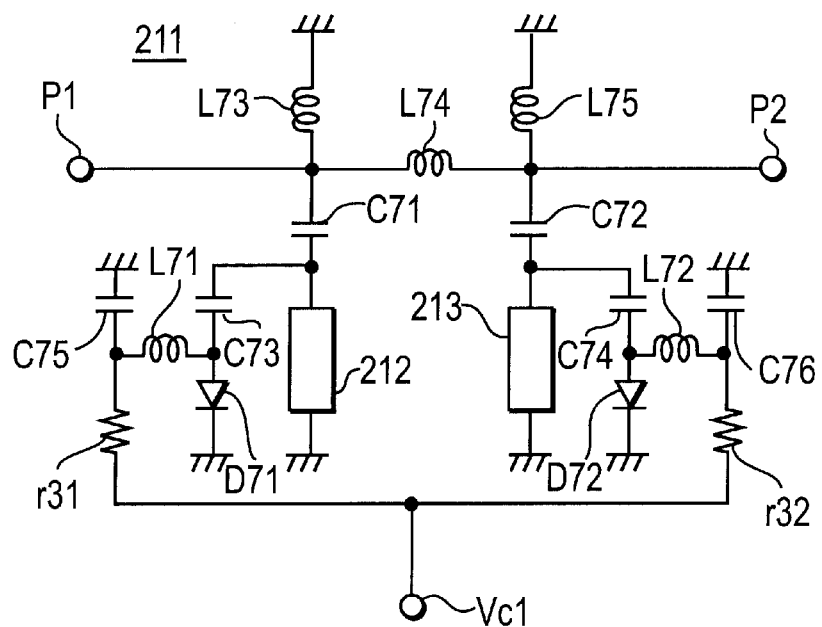
FIG. 15 is an electric circuit diagram of a conventional band elimination filter.
Figure 16:
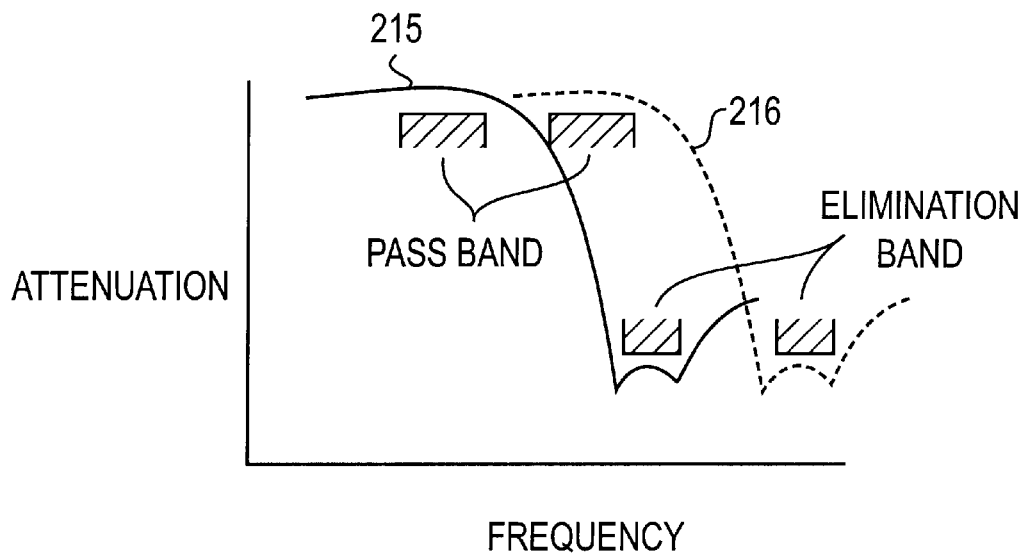
FIG. 16 is a graph showing frequency characteristics of the band elimination filter shown in FIG. 15.

When a positive voltage is applied to the voltage control terminal Vc1 and a negative voltage or 0V is applied to the voltage control terminal Vc2, the PIN diodes D1, D2, D3, and D5 are switched on, whereas the PIN diode D4 is switched off. As a result, the frequency shifting capacitors C5, C6, and C7 of the band pass filter 2 are grounded via the PIN diodes D1, D2, and D3. As shown in FIG. 4, the pass frequency becomes lower. In contrast, since the frequency shifting capacitor C9 of the trap filter 3 is open-circuited, the attenuation-pole frequency becomes higher. The attenuation-pole frequency is thereby set to be a frequency higher than the pass-band frequency of the band pass filter 2. In addition, since the inductive reactance element L10 of the trap filter 3 is grounded via the PIN diode D5, the reactance X of the parallel reactance-element circuit 6 composed of the capacitive reactance element C10 and the inductive reactance element L10 becomes inductive. As a result, the position of the anti-resonance frequency fa of the trap filter 3 is present on a frequency-side lower than the attenuation-pole frequency (as in the conventional example illustrated in FIG. 14B). Additionally, the position of the anti-resonance frequency fa thereof is set within the pass band of the band pass filter 2.

As described above, in the trap-attached frequency-variable band pass filter 1, the pass frequency and the attenuation-pole frequency can be varied by applying control voltages, and the position of the attenuation-pole frequency can be freely switched between the frequency side higher than the pass band and the frequency side lower than the pass band.

Figure 5:
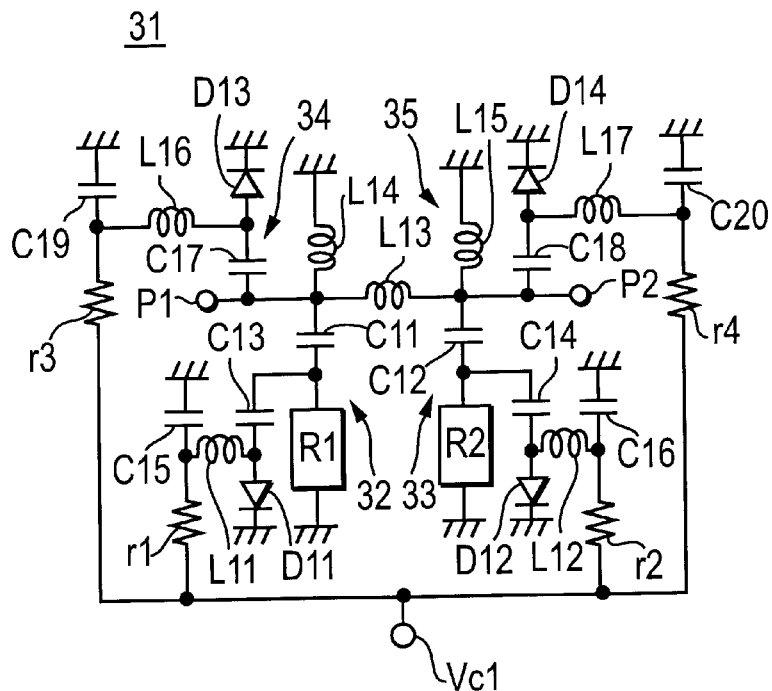
FIG. 5 is an electric circuit diagram of a filter according to another embodiment of the present invention.
Figure 6:
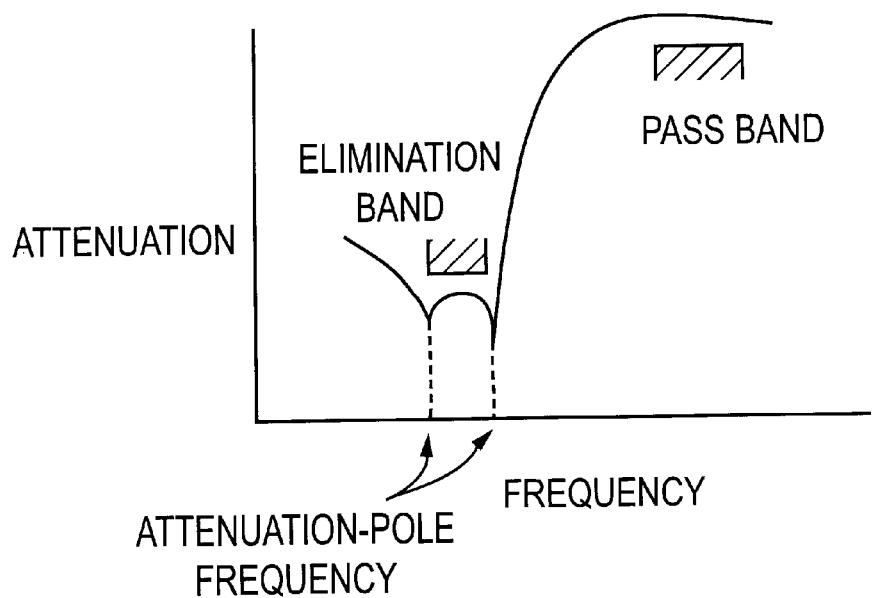
FIG. 6 is a graph showing frequency characteristics for illustrating a function of the filter shown in FIG. 5.
Figure 7:
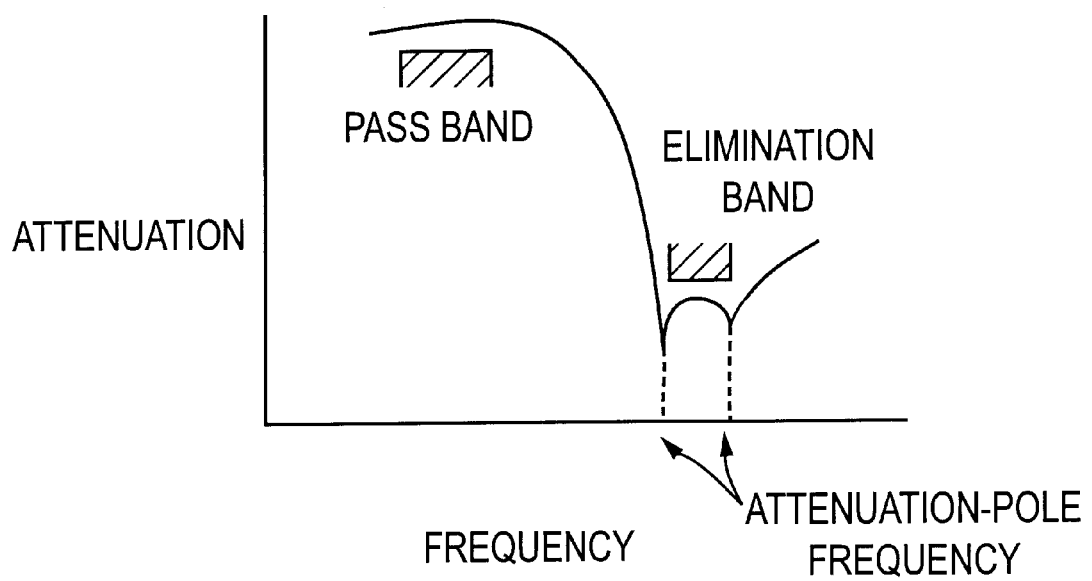
FIG. 7 is a graph showing frequency characteristics for illustrating another function of the filter shown in FIG. 5.

[Second Embodiment: FIGS. 5 to 7]

A second embodiment will be illustrated by using a frequency variable band elimination filter as an example. As shown in FIG. 5, in a frequency variable band elimination filter 31, between external terminals P1 and P2, a trap circuit having a serial resonance section 32 composed of a resonator R1 and a resonance capacitor C11 is electrically connected to a trap circuit having a serial resonance section 33 composed of a resonator R2 and a resonance capacitor C12 via a coupling coil L13. The resonance capacitors C11 and C12 are capacitors for determining the magnitude of an attenuation in an elimination-band.

On the open-end side of the resonator R1, a serial circuit composed of a frequency shifting capacitor C13 and a PIN diode D11 as a voltage-controllable reactance element is electrically connected to the resonator R1 in a state in which the cathode of the PIN diode D1 is grounded. Similarly, on the open-end side of the resonator R2, a serial circuit composed of a frequency shifting capacitor C14 and a PIN diode D12 is electrically connected to the resonator R2. The frequency shifting capacitors C13 and C14 are capacitors for varying two respective attenuation-pole frequencies in the attenuation characteristics of the filter 31.

Furthermore, a serial circuit composed of a capacitive reactance element (capacitor) C17 and a PIN diode D13 as a switching element, and an inductive reactance element (inductor) L14 are electrically connected in parallel to the serial resonance section 32. Similarly, a serial circuit composed of a capacitive reactance element (capacitor) C18 and a PIN diode D14 as a switching element, and an inductive reactance element (inductor) L15 are electrically connected in parallel to the serial resonance section 33. The capacitive reactance elements C17 and C18 and the inductive reactance elements L14 and L15 serve to prevent deterioration in pass-band characteristics of the filter 31.

In this case, the above-described equation (1) provides admittance Y1 of a trap circuit formed by reactance X1 of a parallel reactance-element circuit 34 composed of the capacitive reactance element C17 and the inductive reactance element L14 and the serial resonance section 32. Similarly, the equation (1) also provides admittance Y2 of a trap circuit formed by reactance X2 of a parallel reactance-element circuit 35 composed of the capacitive reactance element C18 and the inductive reactance element L15 and the serial resonance section 33. Thus, in order to prevent deterioration in the pass-band characteristics of the filter 31 caused by a load of the trap circuit, the values of Y1 and Y2 are both set to be zero.

A voltage control terminal Vc1 is connected to the anode of the PIN diode D11 via a resistor r1, a capacitor C15, and a choke coil L11 as shown, and is also connected to the anode of the PIN diode D12 via a resistor r2, a capacitor C16, and a choke coil L12. In addition, the voltage control terminal Vc1 is connected to the anode of the PIN diode D13 via a resistor r3, a capacitor C19, and a choke coil L16, and is also connected to the anode of the PIN diode D14 via a resistor r4, a capacitor C20, and a choke coil L17.

Next, a description will be given of functional effects of the frequency variable band elimination filter 31 having the above structure.

The two attenuation-pole frequencies of the filter 31 are determined by the respective resonance frequencies of a resonance system composed of the resonator R1, the resonance capacitor C11, and the frequency shifting capacitor C13, and a resonance system composed of the resonator R2, the resonance capacitor C12, and the frequency shifting capacitor C14.

When a positive voltage is applied to the voltage control terminal Vc1, the PIN diodes D11 to D14 are all switched on. As a result, since the frequency shifting capacitors C13 and C14 are grounded via the PIN diodes D11 and D12, the two attenuation-pole frequencies become lower. In addition, since the capacitive reactance element C17 is grounded via the PIN diode D13, the reactance X1 of the parallel reactance element circuit 34 composed of the capacitive reactance element C17 and the inductive reactance element L14 becomes capacitive. Similarly, since the capacitive reactance element C18 is grounded via the PIN diode D14, the reactance X2 of the parallel reactance element circuit 35 composed of the capacitive reactance element C18 and the inductive reactance element L15 becomes capacitive. As a result, the position of an anti-resonance frequency fa of the filter 31 is present on a frequency-side higher than the two attenuation-pole frequencies (as in the conventional case shown in FIG. 14A). Therefore, as shown in FIG. 6, the pass-band frequency of the filter 31 is higher than the two attenuation-pole frequencies.

In contrast, when a negative voltage or 0V is applied to the voltage control terminal Vc1, the PIN diodes D11 to D14 are all switched off. As a result, since the frequency shifting capacitors C13 and C14 are open-circuited, the attenuation-pole frequencies become both higher. Additionally, since the capacitive reactance elements C17 and C18 are also open-circuited, the reactance X1 of the parallel reactance-element circuit 34 and the X2 of the parallel reactance-element circuit 35 become both inductive. Thus, the position of the anti-resonance frequency fa of the filter 31 is present on a frequency-side lower than the attenuation-pole frequencies (as in the conventional case shown in FIG. 14B). As a result, as shown in FIG. 7, the pass-band frequency of the filter 31 is lower than the two attenuation-pole frequencies.

As mentioned above, in the frequency variable band elimination filter 31, the pass band and the elimination band can be varied under voltage control. In this filter, the position of the elimination band can be freely switched between a frequency side higher than the pass band and a frequency side lower than the pass band.

Figure 8:
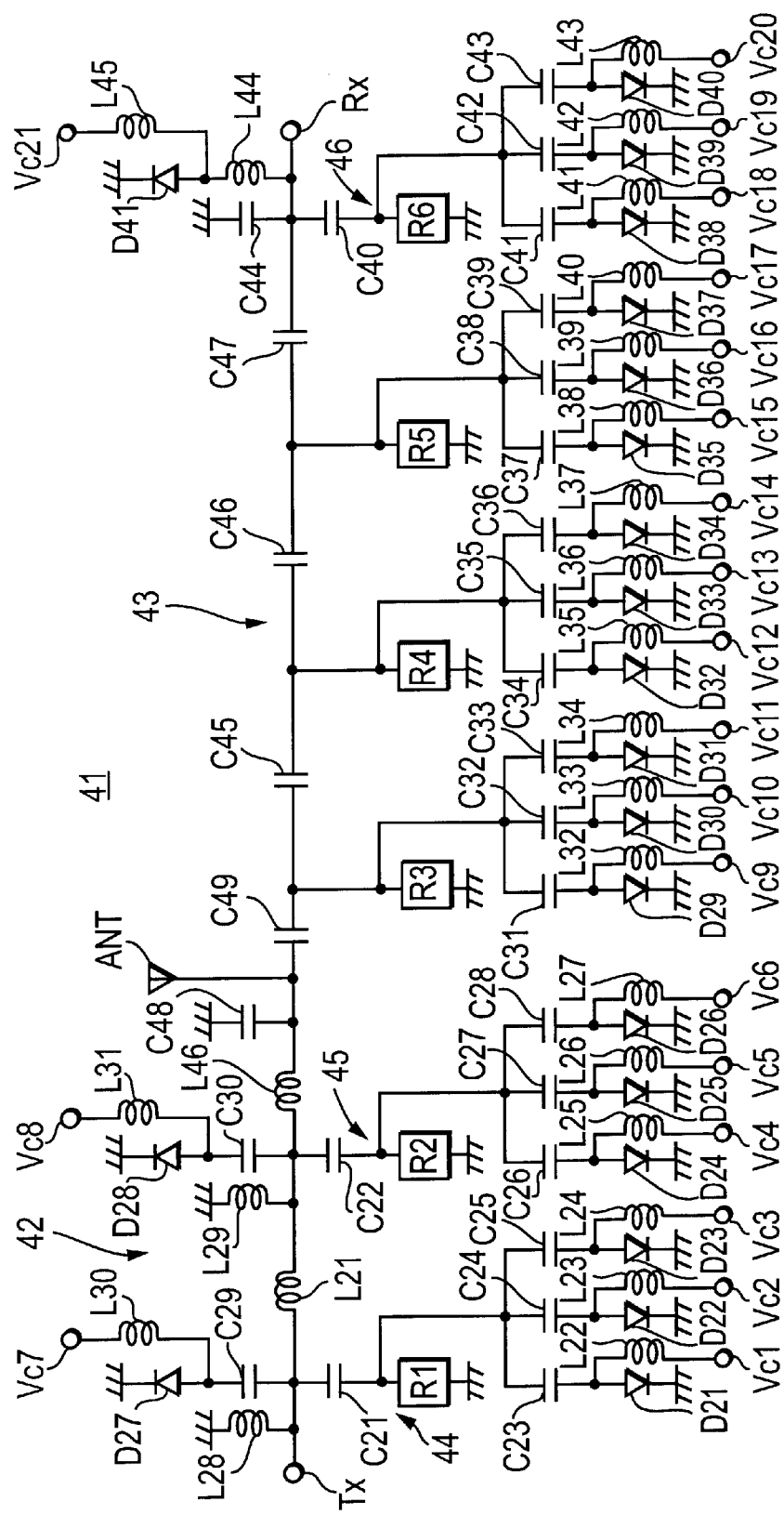
FIG. 8 is an electric circuit diagram of an antenna duplexer according to an embodiment of the present invention.
Figure 9:
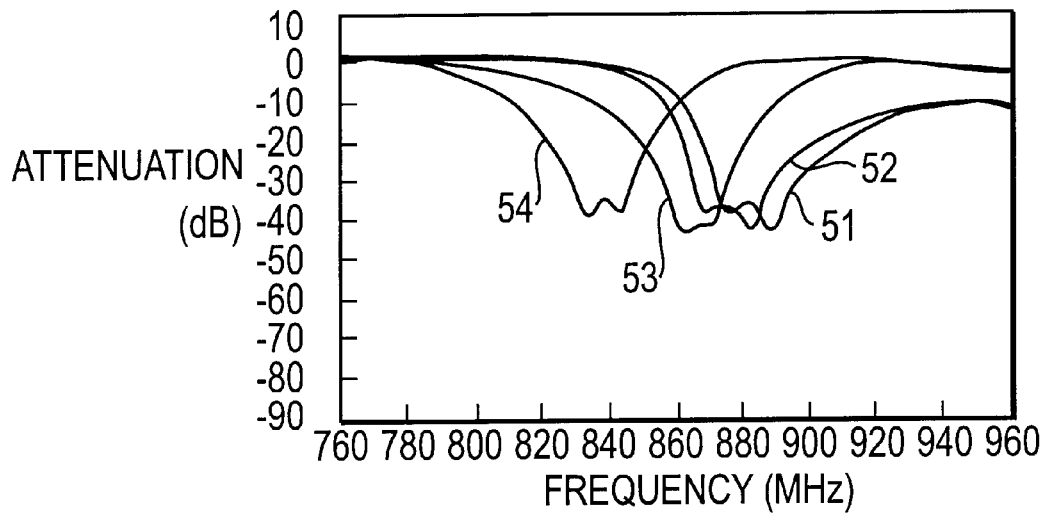
FIG. 9 is a graph showing frequency characteristics of a transmission circuit of the antenna duplexer shown in FIG. 8.
Figure 10:
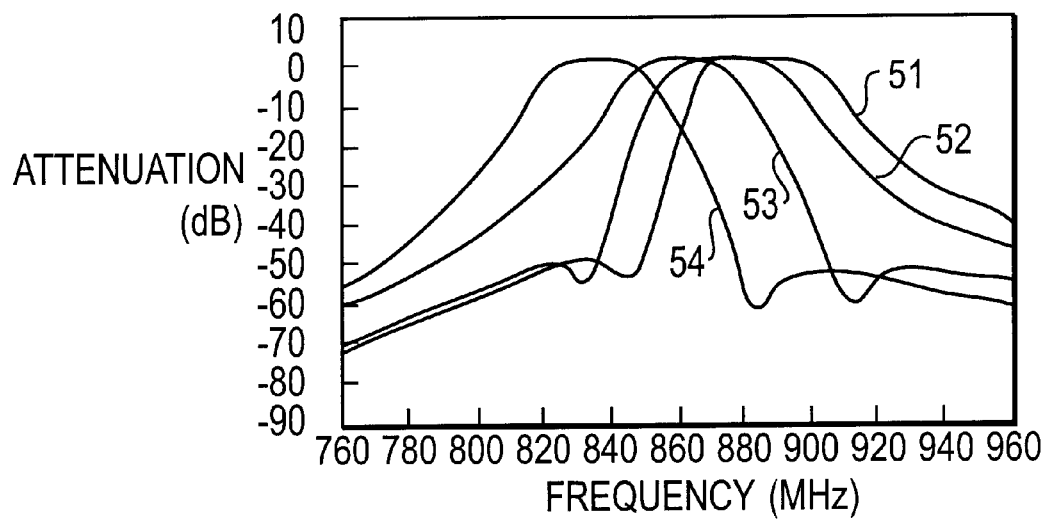
FIG. 10 is a graph showing frequency characteristics of a reception circuit of the antenna duplexer shown in FIG. 8.

[Third Embodiment FIGS. 8 to 10]

A third embodiment will be illustrated in connection with an example of an antenna duplexer adapted for use for example in two kinds of mobile communication systems such as a J-CDMA mobile phone system and a CDMA-800 mobile phone system. As shown in FIG. 8, in an antenna duplexer 41, a transmission circuit 42 is electrically connected between a transmission terminal Tx and an antenna terminal ANT, and a reception circuit 43 is electrically connected between a reception terminal Rx and the antenna terminal ANT.

The transmission circuit 42 is a frequency variable band elimination filter circuit formed by electrically connecting a trap circuit having a serial resonance section 44 composed of a resonator R1 and a resonance capacitor C21 and a trap circuit having a serial resonance section 45 composed of a resonator R2 and a resonance capacitor C22 via a coupling coil L21.

The open-end side of the resonator R1 is connected to a serial circuit composed of a frequency shifting capacitor C23 and a PIN diode D21, a serial circuit composed of a frequency shifting capacitor C24 and a PIN diode D22, and a serial circuit composed of a frequency shifting capacitor C25 and a PIN diode D23. Similarly, the open-end side of the resonator R2 is connected to a serial circuit composed of a frequency shifting capacitor C26 and a PIN diode D24, a serial circuit composed of a frequency shifting capacitor C27 and a PIN diode D25, and a serial circuit composed of a frequency shifting capacitor C28 and a PIN diode D26.

In addition, a serial circuit composed of a capacitive reactance element (capacitor) C29 and a PIN diode D27, and an inductive reactance element (inductor) L28 are electrically connected in parallel to the serial resonance section 44. Similarly, a serial circuit composed of a capacitive reactance element (capacitor) C30 and a PIN diode D28, and an inductive reactance element (inductor) L29 are electrically connected in parallel to the serial resonance section 45.

The above equation (1) provides admittance Y1 of a trap circuit composed of reactance X1 of a parallel reactance-element circuit composed of the capacitive reactance element C29 and the inductive reactance element L28 and the serial resonance section 44. Similarly, the equation (1) also provides admittance Y2 of a trap circuit composed of reactance X2 of a parallel reactance-element circuit composed of the capacitive reactance element C30 and the inductive reactance element L29 and the serial resonance section 45. Then, in order to prevent deterioration in pass band characteristics of the transmission circuit 42 caused by a load of the trap circuit, the values of Y1 and Y2 are both set to be zero.

Voltage control terminals Vc1 to Vc8 are electrically connected to the anodes of the PIN diodes D21 to D28 via choke coils L22 to L27, L30, and L31, respectively.

The transmission circuit 42 formed as the frequency variable band elimination filter circuit described above has variable pass band and attenuation-pole frequency under voltage control, and the position of the attenuation-pole frequency can be freely switched between a frequency side higher than the pass band and a frequency side lower than the pass band.

The reception circuit 43 is a trap-attached frequency-variable band pass filter circuit formed by electrically connecting a three-stage pass band filter circuit formed by electrically connecting resonators R3 to R5 to each other via coupling capacitors C49, C45, C46, and C47, and a trap circuit having a serial resonance section 46 composed of a resonator R6 and a resonance capacitor C40.

A serial circuit composed of a frequency shifting capacitor C31 and a PIN diode D29, a serial circuit composed of a frequency shifting capacitor C32 and a PIN diode D30, and a serial circuit composed of a frequency shifting capacitor C33 and a PIN diode D31 are connected to the open-end side of the resonator R3. Similarly, a serial circuit composed of a frequency shifting capacitor C34 and a PIN diode D32, a serial circuit composed of a frequency shifting capacitor C35 and a PIN diode D33, and a serial circuit composed of a frequency shifting capacitor C36 and a PIN diode D34 are connected to the open-end side of the resonator R4. Additionally, a serial circuit composed of a frequency shifting capacitor C37 and a PIN diode D35, a serial circuit composed of a frequency shifting capacitor C38 and a PIN diode D36, and a serial circuit composed of a frequency shifting capacitor C39 and a PIN diode D37 are connected to the open-end side of the resonator R5.

A serial circuit composed of a frequency shifting capacitor C41 and a PIN diode D38, a serial circuit composed of a frequency shifting capacitor C42 and a PIN diode D39, and a serial circuit composed of a frequency shifting capacitor C43 and a PIN diode D40 are connected to the open-end side of the resonator R6 of the trap circuit.

A capacitive reactance element (capacitor) C44 and a serial circuit composed of an inductive reactance element (inductor) L44 and a PIN diode D41 are electrically connected in parallel to the serial resonance section 46. In this case, the above equation (1) provides admittance Y3 of a trap circuit formed by reactance X3 of a parallel reactance-element circuit composed of the capacitive reactance element C44 and the inductive reactance element L44 and the serial resonance section 46. Then, in order to prevent deterioration in pass-band characteristics of the reception circuit 43 caused by a load of the trap circuit, the value of Y3 is set to be zero.

Voltage control terminals Vc9 to Vc21 are electrically connected to the anodes of the PIN diodes D29 to D41 via choke coils L32 to L43, and L45, respectively. In the reception circuit 43 formed as the trap frequency variable band pass filter circuit, the pass band and the attenuation-pole frequency can be varied by performing voltage control, and the position of the attenuation-pole frequency can be freely switched between a frequency-side higher than the pass band and a frequency-side lower than the pass band.

Next, a description will be given of functional effects of the antenna duplexer 41 having the above structure. In the antenna duplexer 41, a signal transmitted to a transmission terminal Tx (from a transmission-circuit system which is not shown in the figure) is output from the antenna terminal ANT via the transmission circuit 42. In addition, a signal received from the antenna terminal ANT is output from the reception terminal Rx (to a reception-circuit system which is not shown in the figure) via the reception circuit 43.

In the third embodiment, the respective frequency bands of the J-CDMA mobile phone system and the CDMA-800 mobile phone system is split into two parts as shown in the following Table 1.

TABLE 1

|  |  | TRANSMISSION BAND (MHz) | RECEPTION BAND (MHz) |
|---|---|---|---|
| J-CDMA | HIGH-FREQUENCY SIDE | 915–925 | 860–870 |
|  | LOW-FREQUENCY SIDE | 887–901 | 832–846 |
| CDMA 800 | HIGH-FREQUENCY SIDE | 836.5–849 | 881.5–894 |
|  | LOW-FREQUENCY SIDE | 824–836.5 | 869–881.5 |

Then, with combinations as shown in the following Table 2, a positive voltage and a negative voltage or 0V are applied to each of the voltage control terminals Vc1 to Vc21 of the antenna duplexer 41. In Table 2, the numeral "1" indicates the application of a positive voltage, and the numeral "0" indicates the application of a negative voltage or 0V.

TABLE 2

|  | J-CDMA | | CDMA 800 | |
|---|---|---|---|---|
|  | HIGH-FREQUENCY SIDE | LOW-FREQUENCY SIDE | HIGH-FREQUENCY SIDE | LOW-FREQUENCY SIDE |
| Vc1 | 0 | 0 | 0 | 1 |
| Vc2 | 1 | 0 | 0 | 0 |
| Vc3 | 0 | 1 | 0 | 0 |
| Vc4 | 0 | 0 | 0 | 1 |
| Vc5 | 1 | 0 | 0 | 0 |
| Vc6 | 0 | 1 | 0 | 0 |
| Vc7 | 0 | 0 | 1 | 1 |
| Vc8 | 0 | 0 | 1 | 1 |
| Vc9 | 0 | 0 | 0 | 1 |
| Vc10 | 1 | 0 | 0 | 0 |
| Vc11 | 0 | 1 | 0 | 0 |
| Vc12 | 0 | 0 | 0 | 1 |
| Vc13 | 1 | 0 | 0 | 0 |
| Vc14 | 0 | 1 | 0 | 0 |
| Vc15 | 0 | 0 | 0 | 1 |
| Vc16 | 1 | 0 | 0 | 0 |
| Vc17 | 0 | 1 | 0 | 0 |
| Vc18 | 0 | 1 | 0 | 0 |
| Vc19 | 0 | 0 | 1 | 0 |
| Vc20 | 0 | 0 | 0 | 1 |
| Vc21 | 1 | 1 | 0 | 0 |

For example, when the antenna duplexer 41 acts on the high-frequency side of the J-CDMA mobile phone system, a positive voltage is applied to each of the voltage control terminals Vc2, Vc5, Vc10, Vc13, Vc16, and Vc21, and a negative voltage or 0V is applied to the remaining voltage control terminals. As shown here, in the antenna duplexer 41, when the capacitors C23 to C43 and the inductor L44 are either grounded or open-circuited in response to the control voltages, four different pass-band characteristics can be obtained. FIG. 9 is a graph showing frequency characteristics of the transmission circuit 42, and FIG. 10 is a graph showing frequency characteristics of the reception circuit 43. In each of FIGS. 9 and 10, solid lines 51 and 52 indicate characteristics of the high-frequency side and low-frequency side of the CDMA-800 mobile phone system. Solid lines 53 and 54 indicate characteristics of the high-frequency side and low-frequency side of the J-CDMA mobile phone system.

Figure 11:
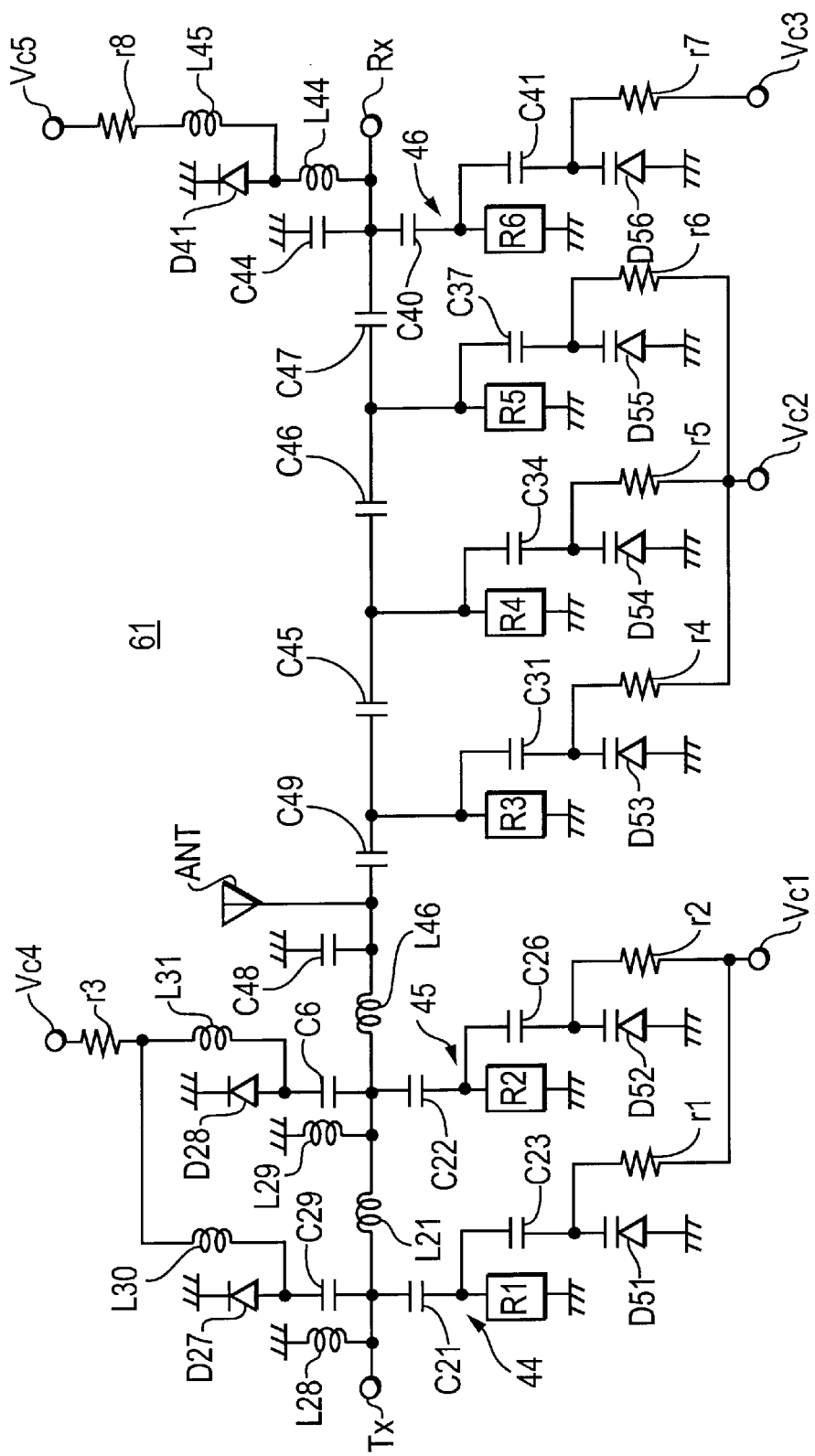
FIG. 11 is an electric circuit diagram of an antenna duplexer according to another embodiment of the invention.

[Fourth Embodiment: FIG. 11]

As shown in FIG. 11, regarding a fourth embodiment, a duplexer 61 uses variable capacitance diodes, as alternatives to the PIN diodes D21 to D26 and D29 to D40 which are the voltage-controllable reactance elements used in the antenna duplexer 41 of the third embodiment shown in FIG. 8, to reduce the number of components.

In general, each of variable capacitance diodes D51 to D56 has characteristics in which as the reverse voltage becomes higher, the capacitance between the anode and the cathode becomes smaller. Thus, the same frequency characteristics as those of the antenna duplexer 41 of the third embodiment can be obtained by applying voltages to the voltage control terminals Vc1 to Vc5 of the antenna duplexer 61 with combinations as shown in the following Table 3. In Table 3, the numeral "1" indicates the application of a positive voltage, and the numeral "0" indicates the application of a negative voltage or 0V. The relationships between voltages V1 to V4 are expressed as V1<V2<V3<V4.

TABLE 3

|     | J-CDMA | | CDMA 800 | |
| --- | --- | --- | --- | --- |
|     | HIGH FREQUENCY SIDE | LOW FREQUENCY SIDE | HIGH FREQUENCY SIDE | LOW FREQUENCY SIDE |
| Vc1 | V2 | V1 | V4 | V3 |
| Vc2 | V2 | V1 | V4 | V3 |
| Vc3 | V4 | V3 | V2 | V1 |
| Vc4 | 0 | 0 | 1 | 1 |
| Vc5 | 1 | 1 | 0 | 0 |

Figure 12:
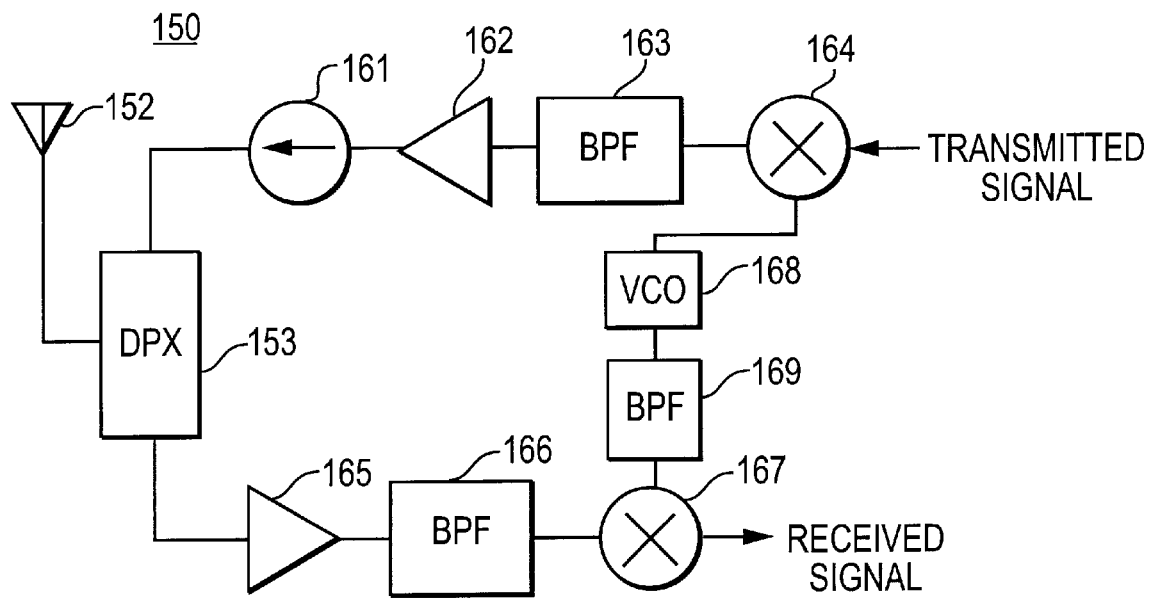
FIG. 12 is an electric circuit block diagram of a communication apparatus according to an embodiment of the invention.
Figure 13:
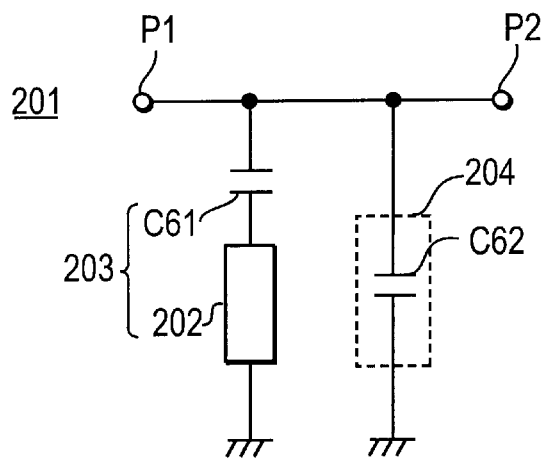
FIG. 13 is an electric circuit diagram of a conventional trap filter.

[Fifth Embodiment: FIG. 12]

A fifth embodiment describes a communication apparatus according to an embodiment of the invention by using an example of a mobile phone.

FIG. 12 is an electric circuit block diagram of the RF section of a mobile phone 150. In FIG. 12, the reference numeral 152 denotes an antenna element, the reference numeral 153 denotes a duplexer, the reference numeral 161 denotes a transmission-side isolator, the reference numeral 162 denotes a transmission-side amplifier, the reference numeral 163 denotes a transmission-side interstage band pass filter, the reference numeral 164 denotes a transmission-side mixer, the reference numeral 165 denotes a reception-side amplifier, the reference numeral 166 denotes a reception-side interstage band pass filter, the reference numeral 168 denotes a voltage-controlled oscillator (VCO), and the numeral reference 169 denotes a local band pass filter.

In this situation, for example, as the duplexer 153, the antenna duplexer 41 of the third embodiment or the antenna duplexer 61 of the fourth embodiment can be used. In addition, as the transmission-side interstage band pass filter 163, the reception-side interstage band pass filter 166, and the local band pass filter 169, for example, the filter 1 of the first embodiment or the filter 31 of the second embodiment can be used. By use of antenna duplexer 41, the filter 1, and the like, freedom of design of the RF section can be increased and the size of the mobile phone can be reduced.

[Other Embodiments]

The filter, the antenna duplexer, and the communication apparatus according to the present invention are not restricted to the above embodiments. Various modifications and changes can be made within the scope of the invention. For example, devices other than PIN diodes, such as a field effect transistor or a variable capacitance diode, may be used as a voltage-controllable reactance element and a switching element. In addition, as the resonators of the serial resonance sections, devices other than dielectric resonators, such as distributed-constant lines (strip lines) and the like may be used.

Furthermore, each dielectric resonator used in the above embodiments is formed by disposing one inner-conductor hole in one dielectric block, that is, by disposing one resonator in one dielectric block. Besides this structure, there may be used a structure in which two or more inner-conductor holes are disposed in one dielectric block, that is, two or more resonators may be disposed in one dielectric block.

In addition, examples of distributed-constant lines (strip lines), include a structure in which a strip conductor is disposed on a conductive substrate via a dielectric member; and a sandwich structure in which a dielectric member is disposed between two conductive substrates and a strip conductor is disposed inside the dielectric member. In this situation, as the above dielectric resonators, two or more strip conductors may be disposed in one block, that is, two or more resonators may be formed in one block.

As described above, in the present invention, by the ON/OFF control of the switching elements, the parallel reactance-element circuit composed of the capacitive reactance element and the inductive reactance element becomes either capacitive or inductive. That is, by the ON/OFF control of the switching elements, the position of the anti-resonance frequency fa can be freely switched between the frequency-side higher than the attenuation-pole frequency and the frequency-side lower than the attenuation-pole frequency. As a result, the filter with which it is possible to control the relationship between the pass band and the attenuation band can be obtained. In addition, the antenna duplexer and the communication apparatus having increased freedom of design and compact size can be obtained.

Although the present invention has been described in relation to particular embodiments thereof, many other variations and modifications and other uses will become apparent to those skilled in the art. Therefore, the present invention is not limited by the specific disclosure herein.

What is claimed is:

1. A filter comprising:
   a trap circuit having a serial resonance section;
   a parallel reactance-element circuit comprising a capacitive reactance element and an inductive reactance element for making an admittance of the trap circuit substantially zero, both reactance elements being electrically connected in parallel to the serial resonance section; and
   a switching element connected to one of the capacitive reactance element and the inductive reactance element, said switching element being switchable on/off to set the reactance of the parallel reactance-element circuit.

2. A filter comprising a plurality of trap circuits, each trap circuit having a serial resonance section and a parallel reactance-element circuit comprising a capacitive reactance element and an inductive reactance element for making an admittance of the trap circuit substantially zero, both reactance elements being electrically connected in parallel to the serial resonance section; and
   a switching element connected to one of the capacitive reactance element and the inductive reactance element, said switching element being switchable on/off to set the reactance of the parallel reactance-element circuit;
   said plurality of trap circuits being electrically connected to each other by one of an inductive element and a capacitive element.

3. A filter comprising:
   a first band pass filter; and
   a second filter electrically connected to the first band pass filter; said second filter comprising:

a trap circuit having a serial resonance section;

a parallel reactance-element circuit comprising a capacitive reactance element and an inductive reactance element for making an admittance of the trap circuit substantially zero, both reactance elements being electrically connected in parallel to the serial resonance section; and a switching element connected to one of the capacitive reactance element and the inductive reactance element, said switching element being switchable on/off to set the reactance of the parallel reactance-element circuit.

4. A filter according to one of claims 1 to 3, further comprising a voltage-controllable reactance element which is electrically connected to each serial resonance section via a frequency shifting capacitor.

5. A filter according to claim 4, wherein the voltage-controllable reactance element is a variable capacitance diode.

6. A filter according to one of claims 1 to 3, wherein the switching element is one of a PIN diode and a field effect transistor.

7. A filter according to one of claims 1 to 3, wherein the serial resonance section includes a dielectric resonator.

8. An antenna duplexer comprising:

a pair of filters, one filter of said pair of filters including:

a trap circuit having a serial resonance section;

a parallel reactance-element circuit comprising a capacitive reactance element and an inductive reactance element for making an admittance of the trap circuit substantially zero, both reactance elements being electrically connected in parallel to the serial resonance section; and a switching element connected to one of the capacitive reactance element and the inductive reactance element, said switching element being switchable on/off to set the reactance of the parallel reactance-element circuit;

each filter of said pair of filters having a first terminal and a second terminal;

said first terminal of one of said pair of filters being connected to a transmitter input terminal and said first terminal of the other of said pair of filters being connected to a receiver output terminal; and said second terminal of each of said pair of filters being connected to an antenna input/output terminal.

9. A communication apparatus comprising the antenna duplexer according to claim 8, further comprising:

a transmitter circuit connected to said transmitter input terminal; and a receiver circuit connected to said receiver output terminal.

10. A communication apparatus comprising a filter according to one of claims 1 to 3, said filter being connected to a high-frequency circuit including at least one of a transmitting circuit and a receiving circuit.

* * * * *